(12) United States Patent
Harada et al.

(10) Patent No.: US 10,883,693 B2
(45) Date of Patent: Jan. 5, 2021

(54) VEHICLE LAMP

(71) Applicant: KOITO MANUFACTURING CO., LTD., Tokyo (JP)

(72) Inventors: Tomoaki Harada, Shizuoka (JP); Masaya Shido, Shizuoka (JP); Toru Ito, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/479,018

(22) PCT Filed: Jan. 11, 2018

(86) PCT No.: PCT/JP2018/000415
§ 371 (c)(1),
(2) Date: Jul. 18, 2019

(87) PCT Pub. No.: WO2018/139202
PCT Pub. Date: Aug. 2, 2018

(65) Prior Publication Data
US 2019/0353322 A1  Nov. 21, 2019

(30) Foreign Application Priority Data
Jan. 25, 2017 (JP) .................. 2017-011452

(51) Int. Cl.
*F21S 43/145* (2018.01)
*F21S 43/19* (2018.01)
(Continued)

(52) U.S. Cl.
CPC ........... *F21S 43/145* (2018.01); *F21S 43/195* (2018.01); *H01L 25/048* (2013.01);
(Continued)

(58) Field of Classification Search
None
See application file for complete search history.

(56) References Cited

U.S. PATENT DOCUMENTS 6,933,686 B1 * 8/2005 Bishel .................. G04G 15/006
                                                     315/293
9,649,976 B2 * 5/2017 Iyoda .................... F21S 43/145
(Continued)

FOREIGN PATENT DOCUMENTS

JP          6-13181 A      1/1994
JP          6013181 B  *   2/1994
(Continued)

OTHER PUBLICATIONS

International Search report (PCT/ISA/210) dated Mar. 27, 2018 issued by the International Searching Authority in International Application No. PCT/JP2018/000415), English translation (Year: 2018).*

(Continued)

*Primary Examiner* — Telly D Green
(74) *Attorney, Agent, or Firm* — Sughrue Mion, PLLC

(57) ABSTRACT

A vehicle lamp 100 includes: an organic EL element 120; a lighting circuit 200 configured to switch between lighting and lighting-off of the organic EL element 120; and a lighting control unit 202 configured to control the lighting circuit 200 so as to repeat instantaneous lighting-off in a state in which the organic EL element 120 is to be lighted. The lighting circuit 200 includes a discharge path 210 formed at least during the instantaneous lighting-off so as to discharge accumulated charges from the organic EL element 120.

7 Claims, 7 Drawing Sheets

(51) Int. Cl.
*H01L 25/04* (2014.01)
*H01L 51/52* (2006.01)
*F21Y 115/15* (2016.01)
*B60Q 1/30* (2006.01)

(52) U.S. Cl.
CPC ...... *H01L 51/5215* (2013.01); *H01L 51/5246* (2013.01); *B60Q 1/30* (2013.01); *F21Y 2115/15* (2016.08); *H01L 2251/5361* (2013.01)

(56) References Cited

U.S. PATENT DOCUMENTS

| | | | | |
|---|---|---|---|---|
| 10,120,038 | B2* | 11/2018 | Harada | H01L 51/0031 |
| 10,295,140 | B2* | 5/2019 | Ito | F21S 43/13 |
| 2002/0003712 | A1* | 1/2002 | Bishel | H04M 11/007 |
| | | | | 363/15 |
| 2006/0087503 | A1* | 4/2006 | Sasaki | G09G 5/00 |
| | | | | 345/211 |
| 2010/0117823 | A1* | 5/2010 | Wholtjen | G08B 21/245 |
| | | | | 340/539.13 |
| 2010/0194786 | A1* | 8/2010 | Iwahara | G09G 3/3406 |
| | | | | 345/690 |
| 2016/0288702 | A1* | 10/2016 | Iyoda | F21S 43/145 |
| 2016/0290586 | A1 | 10/2016 | Shido et al. | |
| 2017/0085082 | A1* | 3/2017 | Lin | H05B 47/16 |
| 2017/0292673 | A1* | 10/2017 | Ito | F21S 43/145 |
| 2017/0328960 | A1* | 11/2017 | Harada | H01L 25/048 |
| 2018/0270921 | A1 | 9/2018 | Shido et al. | |

FOREIGN PATENT DOCUMENTS

| | | | | |
|---|---|---|---|---|
| JP | 2014-165104 | A | | 9/2014 |
| JP | 2014165104 | A | * | 9/2014 |
| JP | 2015-080963 | A | | 4/2015 |
| JP | 2015080963 | A | * | 4/2015 |
| WO | 2015/098822 | A1 | | 7/2015 |
| WO | 2015/141522 | A1 | | 9/2015 |
| WO | WO-2015141522 | A1 | * | 9/2015 ............ H01L 51/56 |

OTHER PUBLICATIONS

International Search Report (PCT/ISA/210) dated Mar. 27, 2018 issued by the International Searching Authority in International Application No. PCT/JP2018/000415.

Written Opinion (PCT/ISA/237) dated Mar. 27, 2018 issued by the International Searching Authority in International Application No. PCT/JP2018/000415.

* cited by examiner

VEHICLE LAMP

TECHNICAL FIELD

The present invention relates to a vehicle lamp, for example, a vehicle lamp using an organic EL element.

BACKGROUND ART

A vehicle lamp using an organic electroluminescence (EL) element, such as an organic EL panel, is attempted to be put into practical use. The organic EL panel is also referred to as an organic light emitting diode (OLED) panel (see, for example, Patent Literature 1).

CITATION LIST

Patent Literature

PTL 1: WO2015/098822

SUMMARY OF INVENTION

Technical Problem

It is known that, when an organic EL element continues to be lighted for a long time, a luminous flux retention rate thereof decreases. Maintenance, such as repairing the organic EL element or replacing the organic EL element with a new one, is necessary if a predetermined light distribution cannot be realized due to the decrease in the luminous flux retention rate. Naturally, frequent occurrence of such operations is not desirable.

The present invention is made in view of these circumstances, and an object of the present invention is to inhibit the decrease in the luminous flux retention rate of the vehicle lamp using the organic EL element.

Solution to Problem

In order to solve the above problem, a vehicle lamp according to an aspect of the present invention includes: an organic EL element; a lighting circuit configured to switch between lighting and lighting-off of the organic EL element; and a lighting control unit configured to control the lighting circuit so as to repeat instantaneous lighting-off in a state in which the organic EL element is to be lighted. The lighting circuit includes a discharge path formed at least during the instantaneous lighting-off so as to discharge accumulated charges from the organic EL element.

According to this aspect, an organic EL type vehicle lamp is provided, which can inhibit the decrease in the luminous flux retention rate. An equivalent circuit of the organic EL element is considered to include a capacitor, and charges are accumulated between two electrodes of the organic EL element during the lighting. It is assumed that electrostatic attraction acting between the two electrodes caused by the accumulated charges is related to the decrease in the luminous flux retention rate of the organic EL element. An adverse effect of the electrostatic attraction is reduced or prevented by discharging the accumulated charges from the organic EL element. Accordingly, the decrease in the luminous flux retention rate of the organic EL element is inhibited or minimized. The accumulated charges are discharged during the instantaneous lighting-off of the organic EL element. Therefore, it is difficult for a driver or a pedestrian to recognize the blinking or lighting-off of the organic EL element. Therefore, the decrease in the luminous flux retention rate of the organic EL element can be inhibited while the organic EL element seems to continue to be lighted for a long time when viewed by human eyes.

The discharge path may include a switch and a discharge resistor that are connected in parallel to the organic EL element. The lighting control unit may form the discharge path by turning on the switch during the instantaneous lighting-off.

The lighting circuit may include a first switch configured to switch between the lighting and the instantaneous lighting-off of the organic EL element. The discharge path may include a second switch and a discharge resistor that are connected in parallel to the organic EL element. The lighting control unit may form the discharge path by turning on the second switch during the instantaneous lighting-off.

A time length of the instantaneous lighting-off may be set to 10 milliseconds or shorter.

A repetition interval of the instantaneous lighting-off may be set to 15 minutes or shorter.

The discharge path may include a discharge resistor connected in parallel to the organic EL element, and the discharge path may be formed also during the lighting of the organic EL element.

The vehicle lamp may further include: a transparent substrate, which includes a surface having a three-dimensional curved surface shape; and a sealing member, which has a three-dimensional curved surface shape matching the three-dimensional curved surface shape of the transparent substrate. The organic EL element may be formed on the three-dimensional curved surface shape of the transparent substrate and be covered by the sealing member.

Advantageous Effects of Invention

According to the present invention, the decrease in the luminous flux retention rate of the vehicle lamp using the organic EL element can be inhibited.

DESCRIPTION OF EMBODIMENTS

Figure 1:
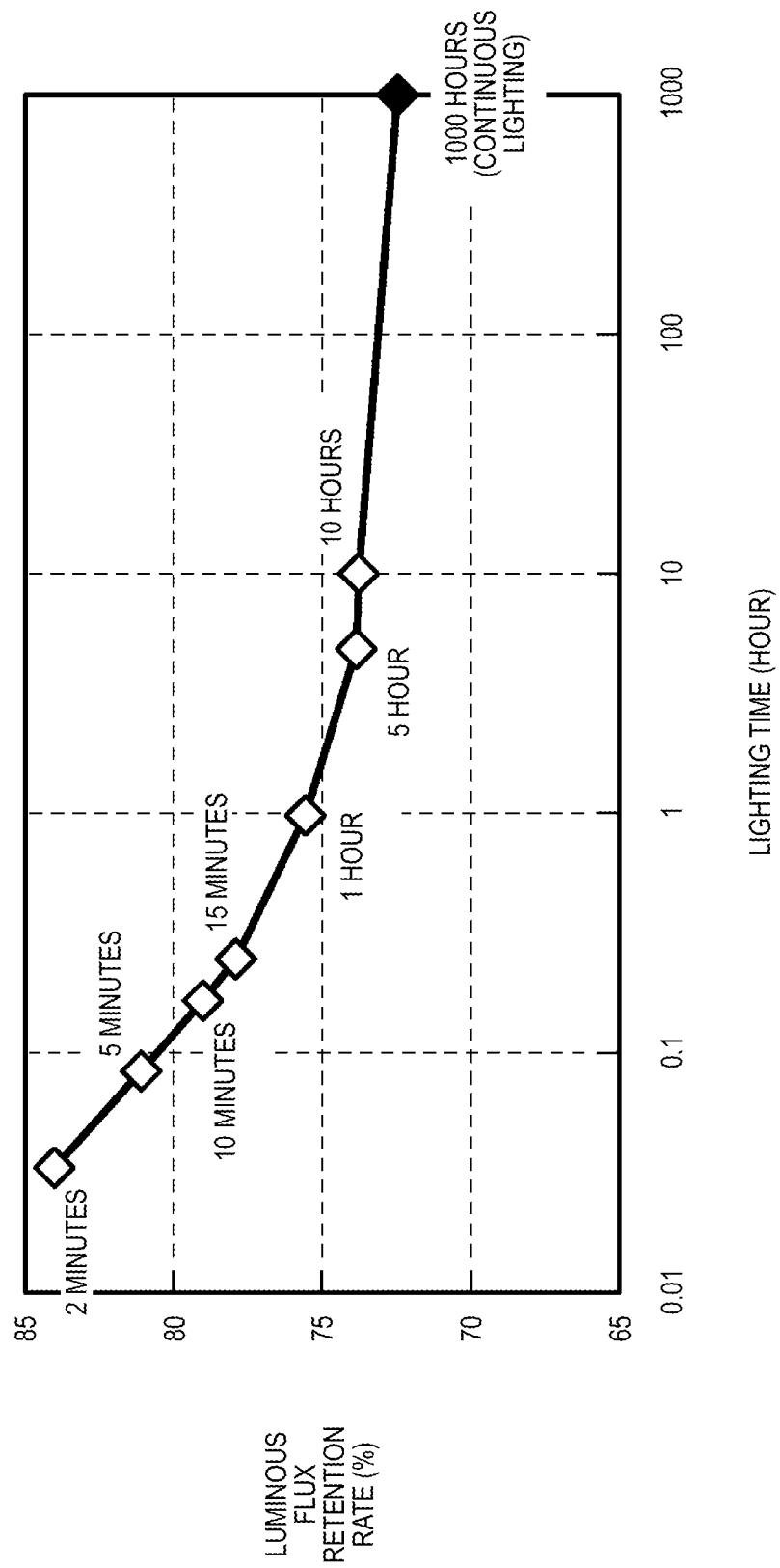
FIG. 1 is a graph showing a result of a measurement of luminous flux retention rates of an organic EL element performed by the present inventors.

Hereinafter, the present invention will be described based on a preferred embodiment with reference to the drawings.

The embodiment is not intended to limit the invention. All the features and combinations thereof described in the embodiment are not necessarily essential to the invention. The same or equivalent components, members, and processes shown in the drawings are denoted by the same reference numerals, and a repetitive description thereof will be omitted. In addition, the scale and shape of each part shown in each of the drawings are set for convenience to simplify the description, and are not to be interpreted as limitations unless otherwise specified. The terms "first", "second" and the like used in the present specification and claims are not intended to represent any order or importance, and are intended to distinguish one configuration from another.

FIG. 1 is a graph showing a result of a measurement of luminous flux retention rates of an organic EL element. A vertical axis indicates the luminous flux retention rates, and a horizontal axis indicates lighting time (turn-on time when blinking) of the organic EL element by logarithm. In FIG. 1, symbols "◇" and "◆" represent measured values. The symbols "◇" are results of a blinking drive test of the organic EL element, and indicate the luminous flux retention rate when a cumulative lighting time reaches 1000 hours. The blinking is performed by repeating lighting (lasting for a lighting time indicated by the horizontal axis, such as 2 minutes, 5 minutes, 10 minutes, 15 minutes, 1 hour, 5 hours and 10 hours) and one-minute lighting-off. The symbol "◆" indicates the luminous flux retention rate after the organic EL element is continuously lighted for 1000 hours instead of blinking.

As can be seen from FIG. 1, the luminous flux retention rate of the organic EL element decreases as the lighting time increases. For example, when the lighting time of the blinking is 15 minutes, the luminous flux retention rate is about 78% when the organic EL element is cumulatively lighted for 1000 hours. When the lighting time of the blinking is 10 hours, the luminous flux retention rate is reduced to about 74% when the organic EL element is cumulatively lighted for 1000 hours. The luminous flux retention rate is reduced to about 72% when the organic EL element is continuously lighted for 1000 hours.

In this way, as compared with an organic EL element continuously lighted over a certain lighting time, luminous flux retention rates of organic EL elements lighted for the same time in a blinking manner is higher. A decrease in the luminous flux retention rate is inhibited better as the lighting time of the blinking becomes shorter. If the lighting time of the blinking is shorter than 15 minutes, the luminous flux retention rate is further improved. For example, for blinking having the lighting time of two minutes, the luminous flux retention rate is improved to about 84%.

It is considered that the decrease in the luminous flux retention rate is caused by charges accumulated in the organic EL element. The charges are accumulated between two electrodes of the organic EL element during the lighting. It is assumed that electrostatic attraction acting between the two electrodes caused by the accumulated charges is related to the decrease in the luminous flux retention rate of the organic EL element. When the organic EL element is driven to blink, if a lighting-off time reaches a certain time length, a natural discharge of the accumulated charges occurs therebetween. It can be understood that the decrease in the luminous flux retention rate due to the blinking is thus inhibited.

Similarly, when the accumulated charges are discharged from the organic EL element by active means, the decrease in the luminous flux retention rate should be inhibited or prevented. In this case, unlike the natural discharge, the accumulated charges can be discharged during a very short lighting-off time that can be said to be instantaneous. The decrease in the luminous flux retention rate of the organic EL element can be inhibited while the organic EL element seems to continue to be lighted when viewed by human eyes.

Based on unique consideration of the present inventors, the present inventors conceived an OLED illumination system which is provided with a mechanism configured to periodically and instantaneously remove accumulated charges of an OLED. By applying this system to a vehicle lamp, as will be described below, the decrease in the luminous flux retention rate can be inhibited without causing a sense of discomfort to a user, such as a driver or a pedestrian.

Figure 2:
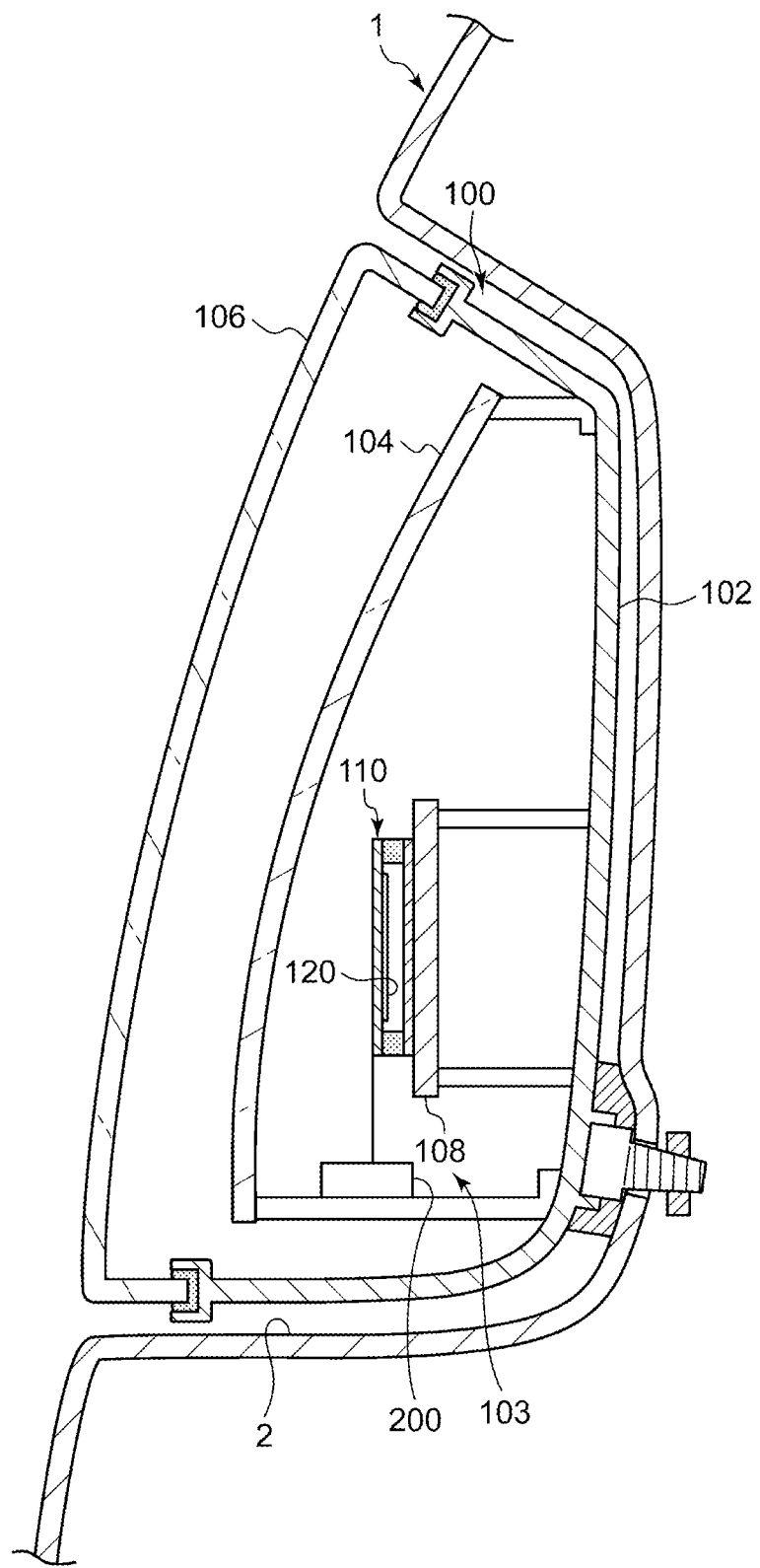
FIG. 2 is a vertical cross-sectional view showing a schematic structure of a vehicle lamp according to an embodiment.

FIG. 2 is a vertical cross-sectional view showing a schematic structure of a vehicle lamp 100 according to an embodiment. The vehicle lamp 100 according to the present embodiment is, for example, a tail lamp disposed behind a vehicle. The vehicle lamp 100 is fixed to a rear panel 1 of the vehicle. Specifically, the rear panel 1 includes a recessed portion 2 recessed toward a vehicle front side, and the vehicle lamp 100 is accommodated in the recessed portion 2. The vehicle lamp 100 is fixed to the rear panel 1 in a state of being accommodated in the recessed portion 2.

The vehicle lamp 100 includes a lamp body 102 and a translucent cover 104. The lamp body 102 is a casing body that includes an opening portion at a vehicle rear side (lamp front side). The translucent cover 104 is attached to the lamp body 102 so as to cover the opening portion of the lamp body 102. The translucent cover 104 is formed of translucent resin, glass, or the like, and functions as an inner cover (inner lens). An outer cover (outer lens) 106 constituting an outer casing of the vehicle lamp 100 is provided on the lamp front side of the translucent cover 104. The outer cover 106 closes an opening of the recessed portion 2.

The lamp body 102 and the translucent cover 104 form a lamp chamber 103. A light source 110 and a lighting circuit 200 are accommodated in the lamp chamber 103. The light source 110 is mounted on a bracket 108. The bracket 108 is fixed to the lamp body 102. A voltage is applied to the light source 110 through the lighting circuit 200. The lighting circuit 200 may be provided outside the lamp chamber 103.

Figure 3:
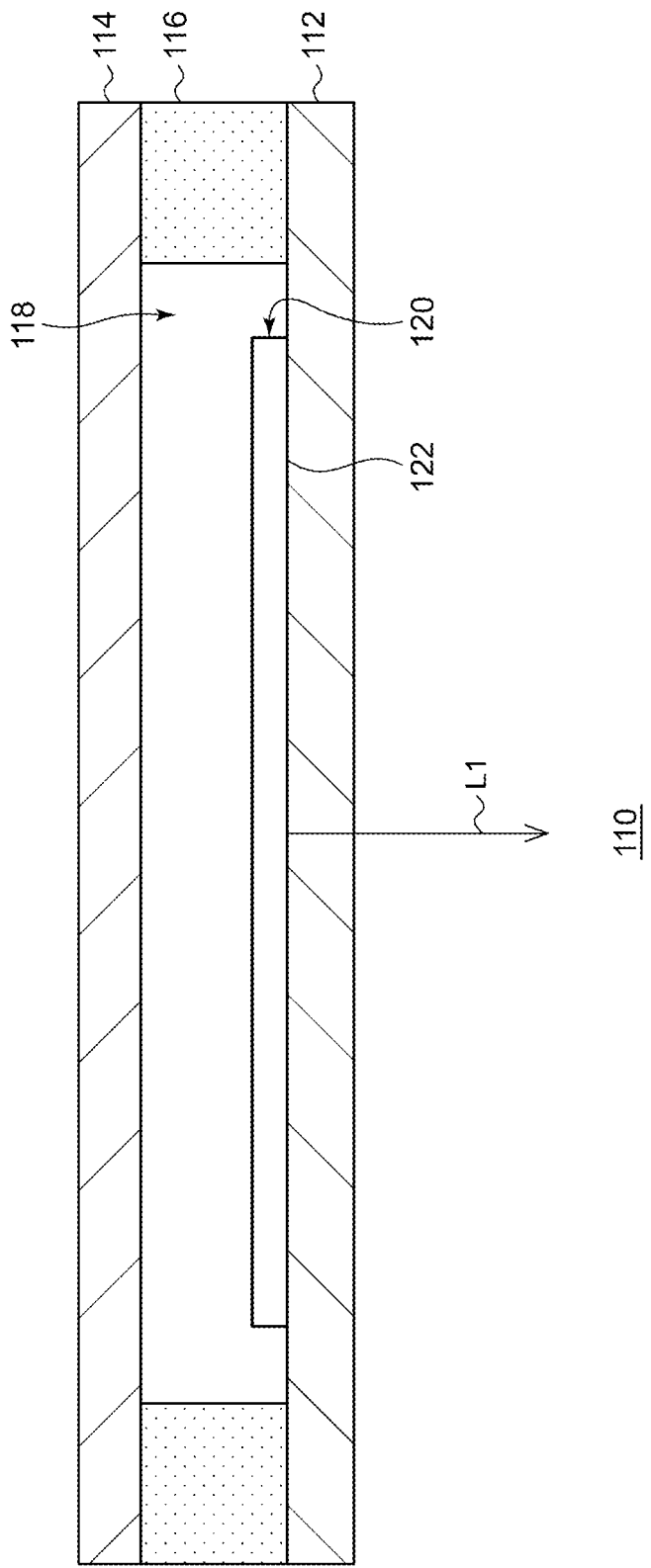
FIG. 3 is a cross-sectional view showing a schematic structure of a light source.

FIG. 3 is a cross-sectional view showing a schematic structure of the light source 110. The light source 110 includes a first substrate 112, a second substrate 114, and a sealing material 116. The sealing material 116 is interposed between the substrates at peripheral edge portions of the first substrate 112 and the second substrate 114. The first substrate 112, the second substrate 114, and the sealing material 116 are made of known materials. For example, the first substrate 112 and the second substrate 114 are glass substrates or translucent resin substrates. The sealing material 116 is, for example, an adhesive that fixes the first substrate 112 and the second substrate 114.

An internal space 118 is formed by the first substrate 112, the second substrate 114, and the sealing material 116. An organic EL element 120 is accommodated in the internal space 118. The organic EL element 120 is a general known organic EL element and includes a light emitting surface 122. Light L1 emitted from the light emitting surface 122 passes through the first substrate 112 and is emitted to a front side of the lamp. The structure of the light source 110 is not particularly limited, the organic EL element 120 may be mounted on a main surface of a substrate, and a structure, in which an upper surface and a side surface of the organic EL element 120 are covered with a sealing material, may be employed.

The organic EL element 120 can provide uniform surface light emission. The organic EL element 120 has a relatively high flexibility and a curved surface shape (so-called 2.5-dimensional curved surface shape). The organic EL element 120 is almost entirely transparent. Therefore, a design of the vehicle lamp 100 can be improved by using the organic EL element 120 in the light source 110. Since the organic EL element 120 is thin and light, a depth dimension of the vehicle lamp 100 can be reduced, and a weight of the vehicular lamp 100 can also be reduced. The organic EL element 120 has lower light directivity than an LED or the like. Therefore, visibility of the vehicle lamp 100 can be improved. The vehicle lamp 100, which is unlikely to give glare to a driver of another vehicle or the like, can be realized.

Figure 4:
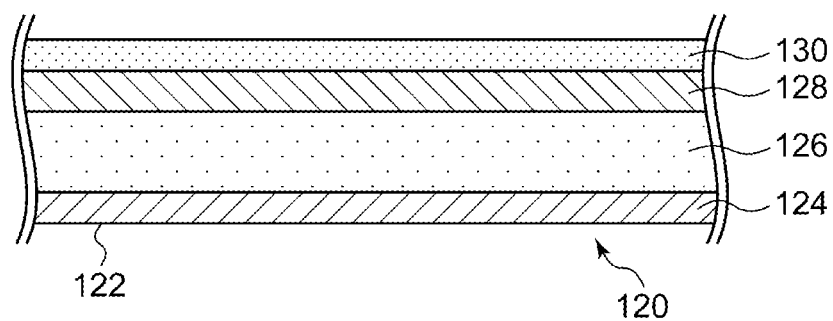
FIG. 4 is a cross-sectional view showing a schematic structure of an organic EL element.

FIG. 4 is a cross-sectional view showing a schematic structure of the organic EL element 120. The organic EL element 120 includes a first electrode 124, an organic layer 126, a second electrode 128, and an inorganic sealing layer 130. For example, the first electrode 124 is an anode and the second electrode 128 is a cathode. The first electrode 124 is a transparent electrode made of ITO or the like, and the second electrode 128 is an aluminum electrode obtained by vapor-depositing aluminum to a metal electrode, for example, the organic layer 126. The organic layer 126 is a light emitting layer disposed between the first electrode 124 and the second electrode 128. The inorganic sealing layer 130 is made of silicon nitride ($SiN_x$), silicon oxide ($SiO_x$), aluminum oxide ($AlO_x$), or the like, and functions as a barrier layer against moisture, oxygen, and the like. The inorganic sealing layer 130 prevents moisture or oxygen, which enters the internal space 118 from an external space, from contacting the second electrode 128 or the like. A thickness of the organic layer 126 is, for example, about 500 nm, and a total thickness of the first electrode 124, the organic layer 126, and the second electrode 128 is, for example, about 1 The light emitting surface 122 corresponds to a surface of the first electrode 124.

Figure 5:
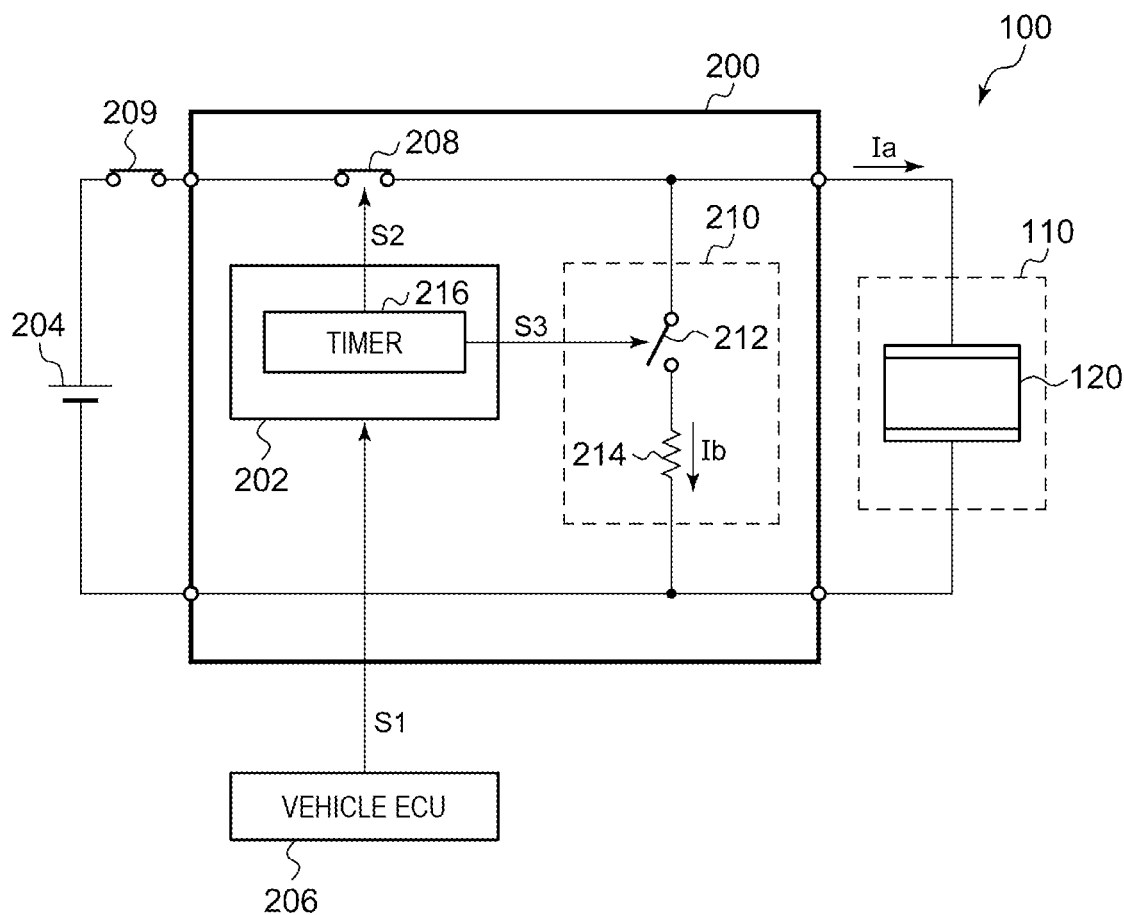
FIG. 5 is a block diagram of the vehicle lamp according to the embodiment.

FIG. 5 is a block diagram of the vehicle lamp 100 according to the embodiment. The vehicle lamp 100 includes the light source 110, the lighting circuit 200, and a lighting control unit 202. As described above, the light source 110 includes the organic EL element 120. The lighting circuit 200 is also referred to as an LED driving module (LDM). The lighting control unit 202 may be a lamp electronic control unit (ECU). A power source 204, such as a battery, and a vehicle ECU 206 are provided in relation to the vehicle lamp 100.

The vehicle ECU 206 is connected to the lighting control unit 202 via a control line, such as a controller area network (CAN) bus, and integrally controls the vehicle lamp 100. A control signal, such as a lighting command S1 configured to instruct lighting and lighting-off of the organic EL element 120 is transmitted from the vehicle ECU 206 to the lighting control unit 202.

The lighting circuit 200 is configured to switch between lighting and lighting-off of the organic EL element 120. The lighting circuit 200 includes a first switch 208 and a discharge path 210. The first switch 208 is disposed on a power supply path from the power source 204 to the organic EL element 120. When the first switch 208 is on, power is supplied from the power source 204 to the organic EL element 120, and the organic EL element 120 is lighted. At this time, an OLED current Ia flows from the power source 204 to the organic EL element 120. When the first switch 208 is off, power supply is stopped, and the organic EL element 120 is extinguished. A light switch 209 is provided in series with the first switch 208 on the power supply path from the power source 204 to the organic EL element 120. Switching between lighting and lighting-off of the organic EL element 120 may be controlled not only by the control signal from the vehicle ECU 206 but also by a driver through manually operating the light switch 209.

The discharge path 210 is formed at least during the instantaneous lighting-off so as to discharge the accumulated charges from the organic EL element 120. The discharge path 210 may also be referred to as a short circuit. The discharge path 210 includes a second switch 212 and a discharge resistor 214 that are connected in parallel to the organic EL element 120. The second switch 212 and the discharge resistor 214 are connected in series. When the second switch 212 is on, the discharge resistor 214 is connected to the organic EL element 120, and the accumulated charges are discharged from the organic EL element 120. At this time, a short circuit current Ib flows from the organic EL element 120 to the discharge resistor 214. When the second switch 212 is off, the discharge resistor 214 is disconnected from the organic EL element 120. The discharge of the accumulated charges through the discharge resistor 214 can be performed by turning on and off the second switch 212 regardless of the on or off of the first switch 208.

The lighting control unit 202 controls the lighting circuit 200 so as to repeat instantaneous lighting-off in a state in which the organic EL element 120 is to be lighted. For example, a state in which the lighting command S1 given from the vehicle ECU 206 to the lighting control unit 202 instructs the lighting of the organic EL element 120 corresponds to the "state in which the organic EL element 120 is to be lighted". On the other hand, a state in which the lighting command S1 instructs the lighting-off of the organic EL element 120 does not correspond to the "state in which the organic EL element 120 is to be lighted".

The "instantaneous lighting-off" of the organic EL element 120 is realized by instantaneously turning off the first switch 208. The lighting control unit 202 turns on the second switch 212 during the instantaneous lighting-off of the organic EL element 120 to form the discharge path 210. The lighting control unit 202 controls the lighting circuit 200 so as to synchronize an instantaneous off of the first switch 208 and an instantaneous on of the second switch 212. Therefore, during the instantaneous lighting-off of the organic EL element 120, the accumulated charges of the organic EL element 120 are consumed by the discharge resistor 214.

A time length of the instantaneous lighting-off of the organic EL element 120 may be set to 10 milliseconds or shorter. In this way, the lighting-off of the organic EL element 120 is not recognized by human eyes. The time length of the instantaneous lighting-off may be set to 1 millisecond or shorter. The time length of the instantaneous lighting-off may be set to 10 microseconds or more.

A repetition interval of the instantaneous lighting-off, that is, a lighting time for each blinking may be set to 15 minutes or shorter. In this way, the decrease in the luminous flux retention rate of the organic EL element 120 can be inhibited, as compared with a case in which the organic EL element 120 is continuously lighted. According to the measurement result shown in FIG. 1, the luminous flux retention rate can be improved from about 72% to about 78% after a total of 1000 hours of lighting. The repetition interval of the instantaneous lighting-off may be set to 10 minutes or shorter, 5 minutes, or 2 minutes. In this way, the luminous flux retention rate can be further improved. The repetition interval of the instantaneous lighting-off may be set to, for example, 1 minute or more or 1 second or more.

The lighting control unit 202 includes a timer 216. The timer 216 can measure elapsed time from any time points. The timer 216 generates a first switch control signal S2 and a second switch control signal S3 in response to the lighting command S1. The timer 216 transmits the first switch control signal S2 to the first switch 208, and transmits the second switch control signal S3 to the second switch 212. The first switch control signal S2 is a signal configured to instruct on and off of the first switch 208, and the second switch control signal S3 is a signal configured to instruct on and off of the second switch 212. The first switch 208 is switched between on and off according to the first switch control signal S2, and the second switch 212 is switched between on and off according to the second switch control signal S3.

Figure 6:
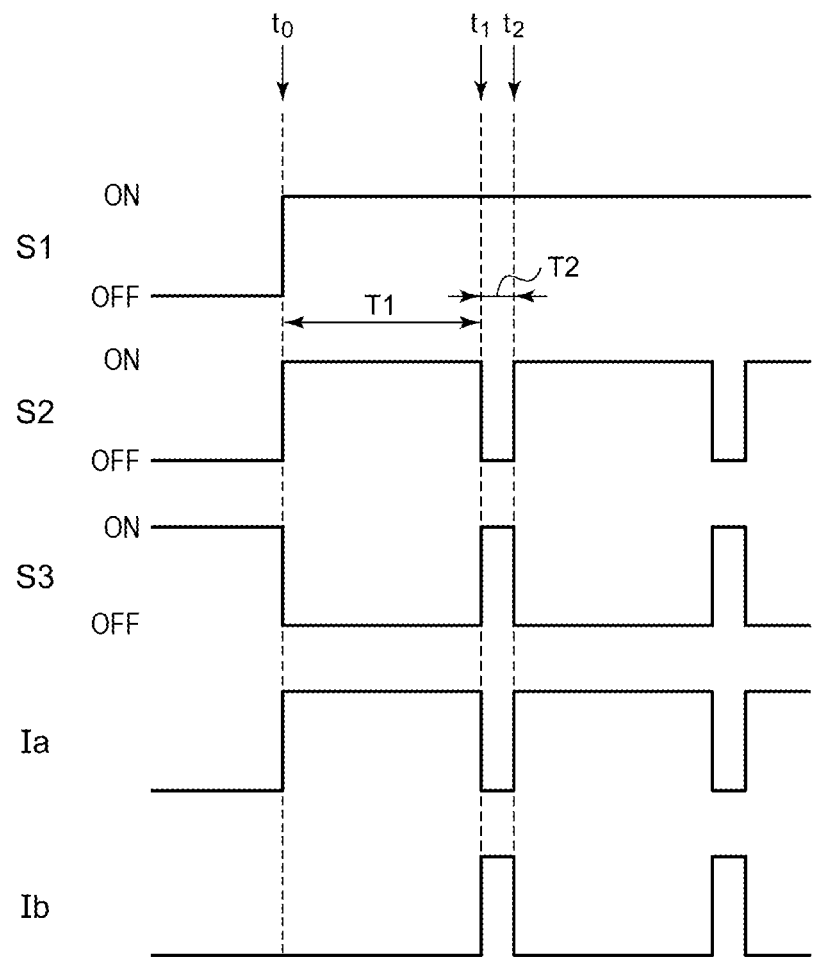
FIG. 6 is an operation waveform diagram of the vehicle lamp according to the embodiment.

FIG. 6 is an operation waveform diagram of the vehicle lamp 100 according to the embodiment. FIG. 6 shows the lighting command S1, the first switch control signal S2, the second switch control signal S3, the OLED current Ia, and the short circuit current Ib in sequence from the top.

The lighting command S1 instructs the lighting-off of the organic EL element 120 until a time point t0. At this time, the first switch control signal S2 instructs the off of the first switch 208, and the second switch control signal S3 instructs the on of the second switch 212. As a result, the organic EL element 120 is extinguished. The discharge resistor 214 is connected to the organic EL element 120, and the discharge path 210 is formed.

At the time point t0, the lighting command S1 shifts from an lighting-off instruction to a lighting instruction. In response, the timer 216 changes the first switch control signal S2 to on, and changes the second switch control signal S3 to off (a first on-off state). The first switch 208 is turned on, the OLED current Ia flows through the organic EL element 120, and the organic EL element 120 is lighted. Meanwhile, the second switch 212 is switched off, and the discharge resistor 214 is disconnected from the organic EL element 120.

The timer 216 continues the first on-off state until a first predetermined time T1 elapses. The first predetermined time T1 corresponds to the "repetition interval of instantaneous lighting-off" described above, and is, for example, a preset time set to 15 minutes or shorter. Here, for example, T1 is set to 5 minutes.

At a time point t1 after the first predetermined time T1 elapsed from the time point to, the timer 216 changes the first switch control signal S2 to off, and changes the second switch control signal S3 to on (a second on-off state). The first switch 208 is switched off, and the organic EL element 120 is extinguished. The second switch 212 is switched on, and the organic EL element 120 is connected to the discharge resistor 214. The charges accumulated during the lighting flows from the organic EL element 120 to the discharge path 210 as the short circuit current Ib. Therefore, the accumulated charges can be removed from the organic EL element 120.

The timer 216 continues the second on-off state until a second predetermined time T2 elapses. As described above, the second predetermined time T2 is a preset time set to a very short period of time which cannot be recognized by the human eyes, for example, 10 milliseconds or shorter. Here, for example, T2 is set to 10 milliseconds.

At a time point t2 after the second predetermined time T2 elapsed from the time point t1, the timer 216 returns from the second on-off state to the first on-off state. While the lighting command S1 instructs the lighting of the organic EL element 120, the first on-off state and the second on-off state are repeated periodically in the same manner.

The OLED current Ia changes periodically in the same manner as the first switch control signal S2. The short circuit current Ib changes periodically in the same manner as the second switch control signal S3.

Figure 7:
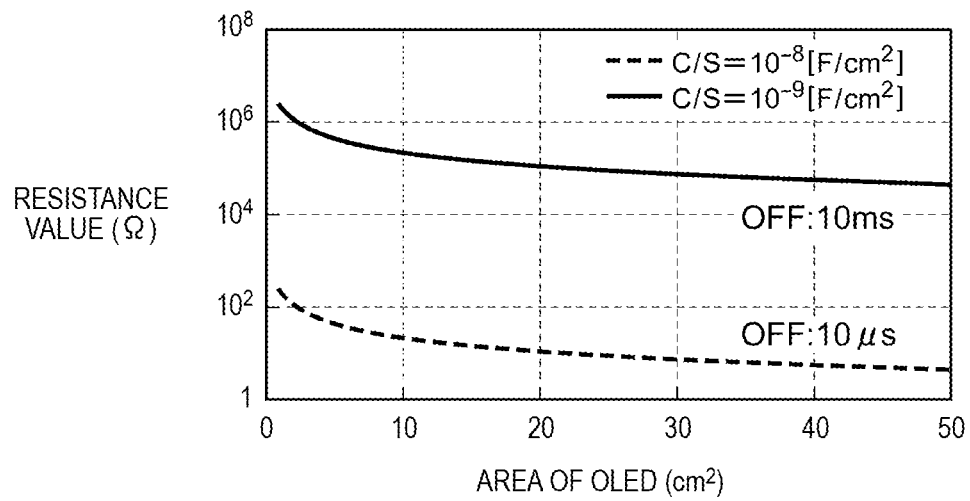
FIG. 7 is a graph exemplifying a resistance value of a discharge path according to the embodiment.

FIG. 7 is a graph exemplifying a resistance value of the discharge path 210 according to the embodiment. A vertical axis represents resistance values by logarithm, and a horizontal axis represents areas of the light emitting surface 122 of the organic EL element 120. This graph is a calculation result of the present inventors, which provides a standard for appropriate resistance values of the discharge resistor 214 in order to sufficiently attenuate the accumulated charges of the organic EL element 120 by instantaneous lighting-off of 10 milliseconds or less.

The organic EL element 120 is regarded as a capacitor in which charges are accumulated. When the second switch 212 is on while both electrodes of the organic EL element 120 are short-circuited, a CR circuit is formed by the discharge path 210 and the organic EL element 120. Therefore, accumulated charges Q of the organic EL element 120 are attenuated exponentially as expressed by the following equation.

$$Q = Q_0 \exp(-t/RC)$$

Here, $Q_0$ refers to initial charges (that is, charges accumulated before the second switch 212 is on), R refers to a resistance value of the discharge resistor 214, and C refers to capacitance of the organic EL element 120. The capacitance of the organic EL element 120 per unit area C/S (S refers to an area of the organic EL element) is generally known to be about $10^{-7}$ to $10^{-9}$ [F/cm$^2$]. Therefore, the resistance value R necessary for attenuating accumulated charges ($Q=10^{-2}Q_0$) from the initial charges $Q_0$ to a certain ratio (for example, 1%) during a set time t (for example, 10 microseconds to 10 milliseconds) can be calculated from the above equation.

As shown in FIG. 7, for example, when t=10 ms and the area of the organic EL element 120 is 50 cm$^2$, the resistance value R of the discharge resistor 214 is about $10^4\Omega$. According to FIG. 7, it is assumed that the resistance value R does not change significantly even if the area of the organic EL element 120 is further enlarged. In a case in which t=10 milliseconds, the resistance value R may be greater than $10^4\Omega$ or less than $10^6\Omega$. In a case in which t=10 microseconds, the resistance value R may be greater than $10\Omega$ or less than $10^3\Omega$. Therefore, the resistance value R may be greater than $10\Omega$, or less than $10^6\Omega$.

As described above, according to the vehicle lamp 100 of the embodiment, the accumulated charges can be discharged from the organic EL element 120 while the organic EL element 120 seems to continue to be lighted when viewed by human eyes. Therefore, the decrease in the luminous flux retention rate can be inhibited without causing a sense of discomfort, for example flickering of illumination light, to a user such as a driver or a pedestrian.

Figure 8:
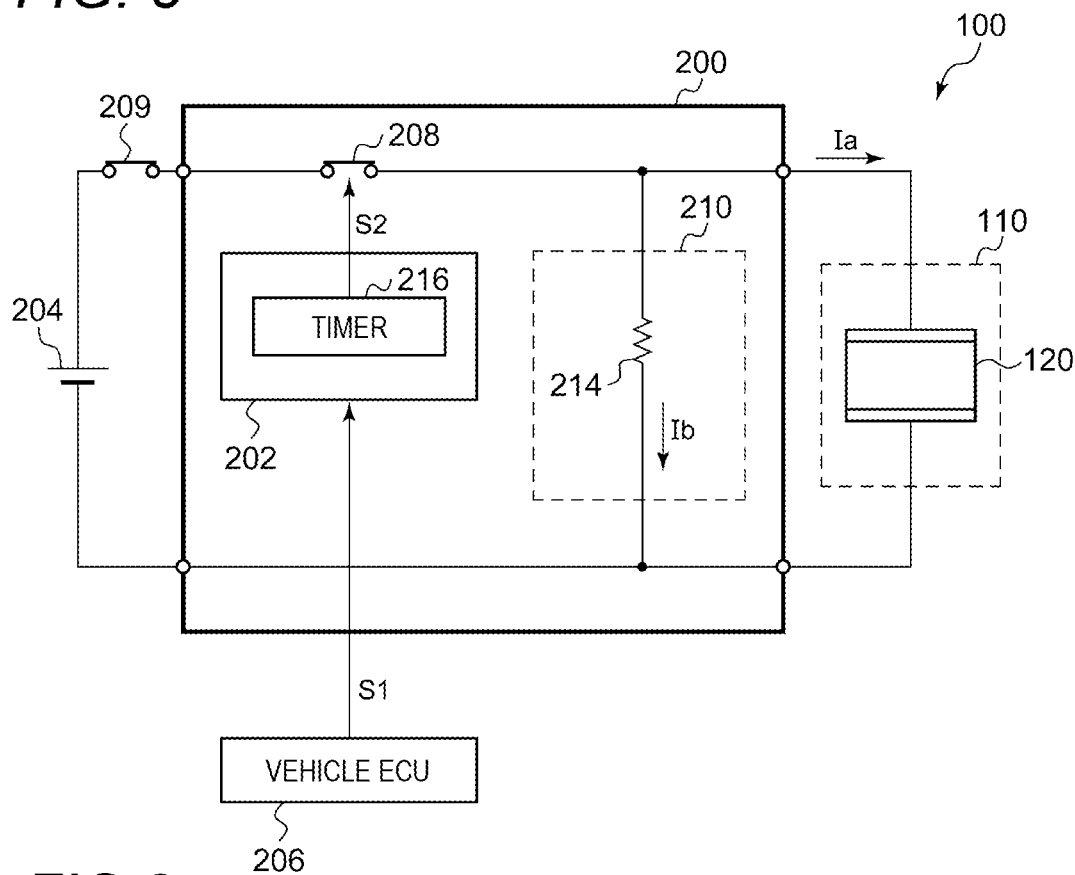
FIG. 8 is a block diagram of a vehicle lamp according to a modification.

FIG. 8 is a block diagram of the vehicle lamp 100 according to a modification. The discharge path 210 includes a discharge resistor 214 connected in parallel to the organic EL element 120. However, as shown in the drawing, the second switch 212 may not be provided in the discharge path 210. That is, the discharge resistor 214 is always connected to the organic EL element 120. The discharge path 210 may be formed not only during the instantaneous lighting-off of the organic EL element 120 but also during the lighting of the organic EL element 120. Even in this case, similarly to the above-described embodiment, the decrease in the luminous flux retention rate can be inhibited without giving the sense of discomfort to the user.

A configuration of the blinking control of the organic EL element according to the embodiment can be applied to other vehicle lamps including organic EL elements, or various organic EL devices. Examples of such devices are provided.

Figure 9:
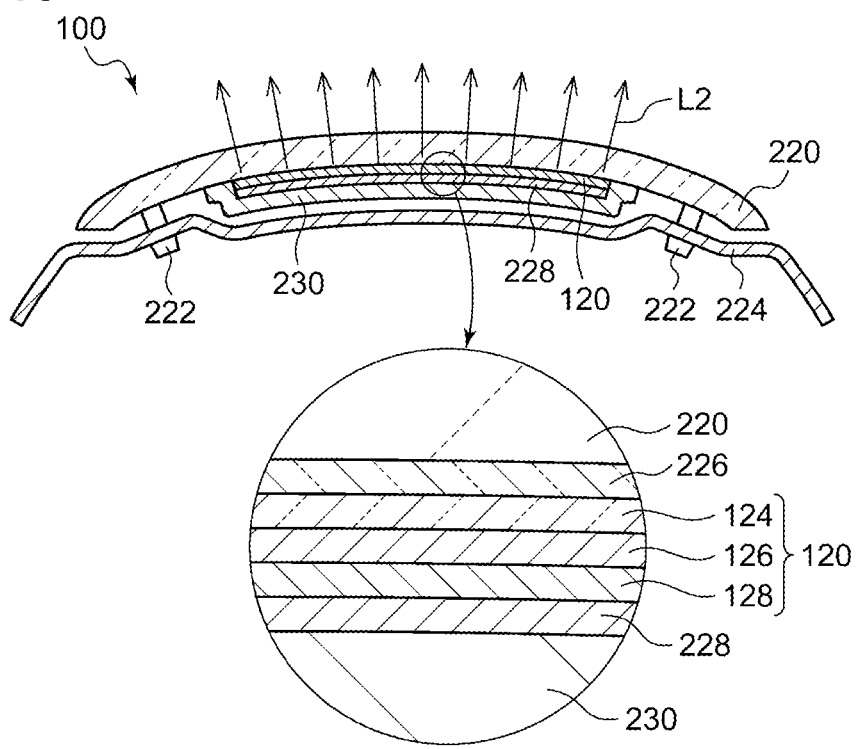
FIG. 9 is a cross-sectional view showing a schematic structure of the vehicle lamp according to the modification.

FIG. 9 is a cross-sectional view showing a schematic structure of the vehicle lamp 100 according to the modification. The vehicle lamp 100 includes a transparent substrate 220, which has a three-dimensional curved surface shape, and the organic EL element 120. The transparent substrate 220 is an outer lens of the vehicle lamp 100. The vehicle lamp 100 is attached to a vehicle body outer plate 224 by an appropriate attaching tool 222. FIG. 9 also shows light L2 emitted from the organic EL element 120.

A barrier layer 226 is formed in advance on a surface of the three-dimensional curved surface shape of the transparent substrate 220. The organic EL element 120 includes the first electrode 124, which is a transparent anode, the organic layer 126, and the second electrode 128, which is a metal cathode. The organic EL element 120 is directly formed on a surface of the transparent substrate 220 using a film forming method such as coating or printing. That is, the first electrode 124, the organic layer 126, and the second electrode 128 are sequentially laminated above the barrier layer 226. In this way, the organic EL element 120 is formed on the surface of the three-dimensional curved surface shaped transparent substrate 220.

The organic EL element 120, together with a desiccant sheet 228, is covered with an adhesive sealing plate 230. The adhesive sealing plate 230 is an example of a sealing member having a three-dimensional curved surface shape matching the three-dimensional curved surface shape of the transparent substrate 220. The desiccant sheet 228 is overlaid on the second electrode 128 of the organic EL element 120, and the adhesive sealing plate 230 is bonded thereon. The desiccant sheet 228 and the adhesive sealing plate 230 may be opaque. The adhesive sealing plate 230 may be, for example, a resin film attached with a barrier film, a metal foil, or the like. The adhesive sealing plate 230 can have a three-dimensional curved surface shape as that of the transparent substrate 220. If sufficient sealing performance is achieved by the barrier layer 226 and the adhesive sealing plate 230, the desiccant sheet 228 may be omitted.

In this way, the organic EL type vehicle lamp 100, which has a three-dimensional curved surface shape, can be realized with a simple structure. Such a simple structure can reduce reflection of light output from the organic EL element 120. As a result, advantages such as improvement in light emission efficiency and reduction in power consumption can be obtained. An organic EL panel can be relatively easily adapted to a complicated three-dimensional shape of a vehicle body outer plate.

Figure 10:
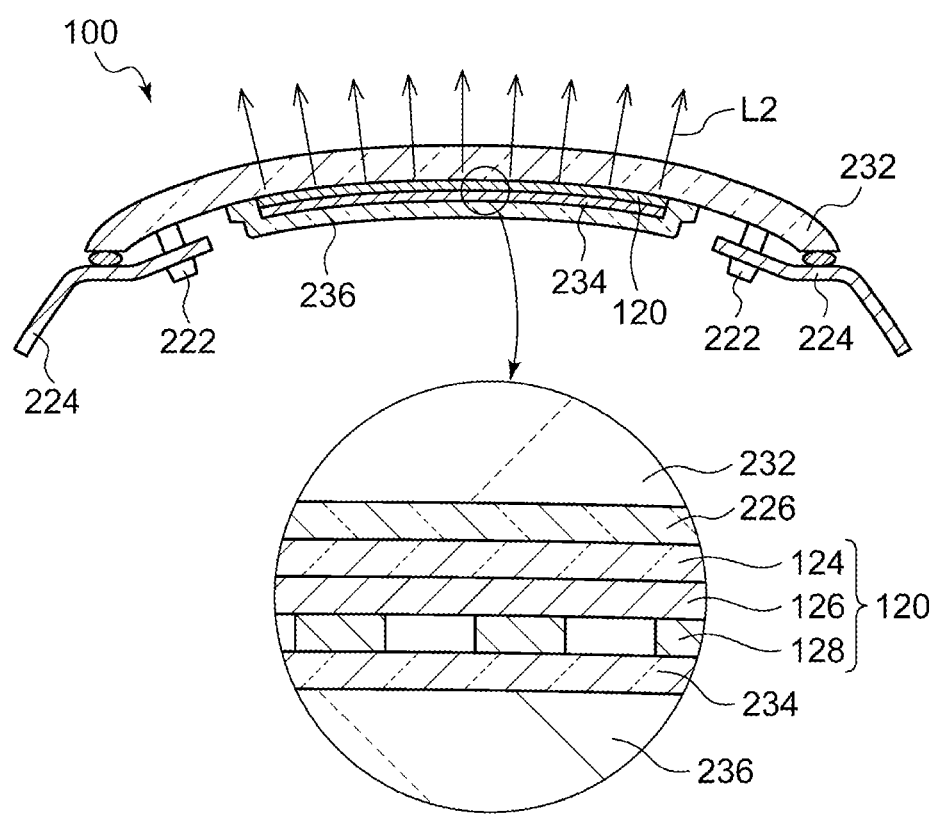
FIG. 10 is a cross-sectional view showing a schematic structure of a vehicle lamp according to another modification.

FIG. 10 is a cross-sectional view showing a schematic structure of the vehicle lamp 100 according to another modification. The vehicle lamp 100 shown in FIG. 10 is integrated into a vehicle window 232. The window 232 has a three-dimensional curved surface shape. The window 232 is made of, for example, transparent resin, and a barrier layer 226 is formed on a surface of the window 232. The organic EL element 120 is directly formed on the barrier layer 226 using a film forming method such as coating or printing. The second electrode 128 of the organic EL element 120 is formed in a stripe shape. The organic EL element 120, together with a transparent desiccant sheet 234, is covered with a transparent sealing plate 236. Therefore, the vehicle lamp 100 is configured as a so-called see-through organic EL panel. In this way, the organic EL device, which has a three-dimensional curved surface shape, can be realized with a simple structure.

The vehicle lamp 100 shown in FIGS. 9 and 10 may not have the configuration of the blinking control of the organic EL element described with reference to FIGS. 1 to 8.

The present invention is not limited to the embodiment and the modifications described above, and further modifications are also possible, such as combinations of the embodiment and the modifications, and various design changes made based on knowledge of a person skilled in the art. Embodiments and modifications to which such combinations are added are also included in the scope of the present invention. The above-described embodiment, modifications, and new embodiments made by combination of the above-described embodiment, modifications, and the following modifications also have effects of combined embodiments, modifications, and further modifications.

In the embodiment described above, the case in which the vehicle lamp 100 is a tail lamp was described as an example, but the vehicle lamp 100 is not limited to this specific example. The vehicle lamp 100 may be a marker lamp such as a turn signal lamp, a daytime running lamp, or a clearance lamp, or a headlamp, a brake lamp, or the like.

REFERENCE SIGNS LIST

100 Vehicle Lamp
120 Organic EL Element
200 Lighting Circuit
202 Lighting Control Unit
208 First Switch
210 Discharge Path
212 Second Switch
214 Discharge Resistor
216 Timer

INDUSTRIAL APPLICABILITY

The present invention can be applied to a vehicle lamp, for example, a vehicle lamp using an organic EL element.

The invention claimed is:
1. A vehicle lamp, comprising:
   an organic EL element;
   a lighting circuit configured to switch between lighting and lighting-off of the organic EL element; and
   a lighting control unit configured to control the lighting circuit so as to repeat instantaneous lighting-off in a state in which the organic EL element is to be lighted,
   wherein the lighting circuit includes a discharge path formed at least during the instantaneous lighting-off so as to discharge an accumulated charge from the organic EL element, and
   a repetition interval of the instantaneous lighting-off is set to 2 minutes or longer.
2. The vehicle lamp according to claim 1, wherein the discharge path includes a switch and a discharge resistor that are connected in parallel to the organic EL element, and
   the lighting control unit forms the discharge path by turning on the switch during the instantaneous lighting-off.

3. The vehicle lamp according to claim 1, wherein the lighting circuit includes a first switch configured to switch between the lighting and lighting-off of the organic EL element,
- the discharge path includes a second switch and a discharge resistor that are connected in parallel to the organic EL element, and
- the lighting control unit forms the discharge path by turning on the second switch during the instantaneous lighting-off.

4. The vehicle lamp according to claim 1, wherein a time length of the instantaneous lighting-off is set to 10 milliseconds or shorter.

5. The vehicle lamp according to claim 1, wherein the repetition interval of the instantaneous lighting-off is set to 15 minutes or shorter.

6. The vehicle lamp according to claim 1, wherein the discharge path includes a discharge resistor connected in parallel to the organic EL element, and the discharge path is formed also during the lighting of the organic EL element.

7. The vehicle lamp according to claim 1, further comprising:
- a transparent substrate, which includes a surface having a three-dimensional curved surface shape; and
- a sealing member, which has a three-dimensional curved surface shape matching the three-dimensional curved surface shape of the transparent substrate,
  - wherein the organic EL element is formed on the surface of three-dimensional curved surface shape of the transparent substrate and is covered by the sealing member.

* * * * *